US006128810A

United States Patent [19]

Suzuki et al.

[11] Patent Number: 6,128,810

[45] Date of Patent: Oct. 10, 2000

[54] DEVICE FOR MOUNTING CONNECTOR TERMINALS USED FOR WIRE HARNESS

[75] Inventors: Toshiaki Suzuki; Naoki Tamura, both of Nagoya, Japan

[73] Assignees: Harness System Technologies, Ltd., Nagoya; Sumitomo Wiring Systems, Ltd., Mie; Sumitomo Electric Industries, Ltd., Osaka, all of Japan

[21] Appl. No.: 09/009,889

[22] Filed: Jan. 21, 1998

[30] Foreign Application Priority Data

Jan. 28, 1997 [JP] Japan .................................... 9-013870

[51] Int. Cl.[7] ........................... H01R 43/20; H01F 41/10; H05K 3/30

[52] U.S. Cl. ...................... 29/33 M; 29/564.6; 29/566.2; 29/739

[58] Field of Search .................................... 29/33 M, 738, 29/564.4, 564.6, 739, 748, 605, 566.2, 837, 747, 854, 564.1, 759; 227/93, 119

[56] References Cited

U.S. PATENT DOCUMENTS

| | | | |
|---|---|---|---|
| 3,556,382 | 1/1971 | Busler et al. | 227/93 |
| 4,041,604 | 8/1977 | Ackley | 29/854 |
| 4,176,448 | 12/1979 | Zanh et al. | 29/837 |
| 4,211,001 | 7/1980 | White et al. | 29/747 |
| 4,447,948 | 5/1984 | Golinski | 227/119 X |
| 4,451,975 | 6/1984 | Baccei | 29/739 X |
| 4,672,735 | 6/1987 | Tamano et al. | 29/564.6 |
| 4,912,823 | 4/1990 | Shah et al. | 29/33 M |
| 5,074,030 | 12/1991 | Anderson et al. | 29/739 |
| 5,761,796 | 6/1998 | Imgrüt et al. | 29/748 |

FOREIGN PATENT DOCUMENTS

| | | | |
|---|---|---|---|
| 46076 | 2/1982 | European Pat. Off. | 29/564.4 |
| 467451 | 1/1992 | European Pat. Off. | 29/605 |
| 404349381 | 12/1992 | Japan | 29/33 M |

*Primary Examiner*—William Briggs
*Attorney, Agent, or Firm*—Oliff & Berridge, PLC

[57] ABSTRACT

Disclosed is a device for automatically mounting a crimp-style terminal on a connector housing which can have one or more vacant cavities. The mounting device is to be applied in production in which connectors can have varying numbers of terminals. Housings are accurately fed by a plurality of parts feeders and guides. Empty housings and housings with inserted terminals are held, respectively, by separate magazines. Terminals are individually cut off from a terminal hoop and individually set into insertion positions in front of a housing. After all terminals have been set, the terminals are inserted into the cavities all at once.

6 Claims, 20 Drawing Sheets

DEVICE FOR MOUNTING CONNECTOR TERMINALS USED FOR WIRE HARNESS

BACKGROUND OF THE INVENTION

1. Field of Invention

The present invention relates to a device for mounting terminals on a connector housing of a wire harness used for an automobile.

2. Description of Related Art

An example of a connector C used for a wire harness is shown in FIGS. 20(*a*) and 20(*b*). This connector C is composed of an upper housing $C_1$ and a lower housing $C_2$. As shown in FIG. 20(*a*), crimp-style terminals t are mounted on (inserted into) predetermined cavities b of the housings $C_1$, $C_2$, which will collectively be referred to as a connector C hereinafter, and the crimp-style terminals t are connected (crimped) with electrical wires a that are part of a wire harness. As shown in FIG. 20(*b*), the upper housing $C_1$ is engaged with the lower housing $C_2$ when the cover $C'_1$ is rotated to a closed position.

When the terminals t are automatically mounted on connector C, it is common that the terminals t are cut off from a terminal hoop T and individually inserted into the cavities b as shown in FIG. 20(*a*).

In the conventional example of an automatic mounting device for automatically mounting the terminals t on a connector C, the terminals t, the number of which is predetermined corresponding to the number of the cavities of connector C, are cut off all at once from the terminal hoop T, and the terminals t are inserted into the corresponding cavities b all at once. Although productivity of this automatic mounting device is high, it is impossible to apply this mounting device to different connectors C having a different number of cavities b (the number of poles). Consequently, in production, the conventional mounting device can be applied only to a limited number of terminal configurations.

Recently, the number of different types of connectors that are produced has tended to increase while the number of connectors of the same type that are produced has tended to decrease. Therefore, when the above conventional mounting device is used, production costs will likely be greater than with use of the proposed device.

SUMMARY OF THE INVENTION

It is therefore an object of the present invention to provide a mounting device to be applied to production in which an increased number of different types of connectors is used compared to the number of connectors of the same type.

In accordance with the present invention, a device for mounting connector terminals used for a wire harness is disclosed, comprising: a terminal cutting means for individually cutting each terminal from a terminal hoop; a setting means for individually setting the cut terminal at an inserting position in front of a terminal cavity of a connector housing; an inserting means for inserting all terminals into the cavities after the terminals have been set at the inserting positions in front of all terminal cavities of the connector housing; and an accommodating means for accommodating the connector housings into which the terminals have been inserted, wherein the above means are successively arranged along a conveyance passage of a conveyance means for linearly conveying the connector housings while the conveyance means holds the connector housings.

The cut terminals are successively set at inserting positions in front of the corresponding cavities of the connector housing except for cavities (vacant cavities) into which no terminals are inserted (mounted). After all terminals are set, they are inserted into the connector all at once. When the terminals are individually cut off and set in the above manner, it is possible to apply the above mounting device to diverse connector housings having differing numbers of cavities (poles). Further, it is possible to avoid a case in which terminals are unnecessarily inserted into vacant cavities. When all terminals are inserted into the connector all at once, the working efficiency can be enhanced.

Fixed cutting and setting positions are established along the conveyance passage. After the terminal setting means places a cut terminal at an inserting position, the conveyance means conveys the connector housing at intervals defined by the distance between adjacent terminal cavities so as to allow the housing to cooperate with the fixed cutting and setting positions. Therefore, even if the connector has vacant cavities, the terminals can be easily mounted on the connector.

The conveyance means includes two chuck mechanisms for holding the connector housings in a predetermined way. The housings are fed to the chuck mechanisms one by one. These chuck mechanisms are arranged on both sides of the conveyance passage along the conveyance passage so that the chucks can be retracted from the conveyance passage.

In accordance with the invention, a chuck which conveys a connector housing is moved in the conveyance passage and a vacant chuck is moved in a retracting passage, so that the interference between both chucks can be avoided. When both chuck mechanisms are made to alternatively participate in a conveyance action, the production operation can be continuously conducted without disturbing the cycle of cutting, setting and inserting the terminals.

The chuck mechanism of the conveyance means is capable of moving along the conveyance passage when the chuck mechanism is attached to a ball and screw device that is driven by a servo motor. The above arrangement allows accurate movement of the chuck mechanism, and therefore, causes the connector housing to be conveyed with great accuracy.

The connector housings are fed to the conveyance means by a plurality of parts feeders. Guides for moving the connector housings accommodated in the parts feeders into a predetermined position are arranged between the parts feeders and the connector housing feed position. Each guide corresponds to a respective parts feeder, and each guide can selectively correspond to the conveyance passage.

This arrangement provides for a predetermined connector housing to be accommodated in each parts feeder. After a parts feeder is selected, a connector housing, stabilized by corresponding guides, is conveyed in a stable manner so that a plurality of terminals can be accurately mounted onto the housing.

DETAILED DESCRIPTION OF PREFERRED EMBODIMENTS

Figure 1:
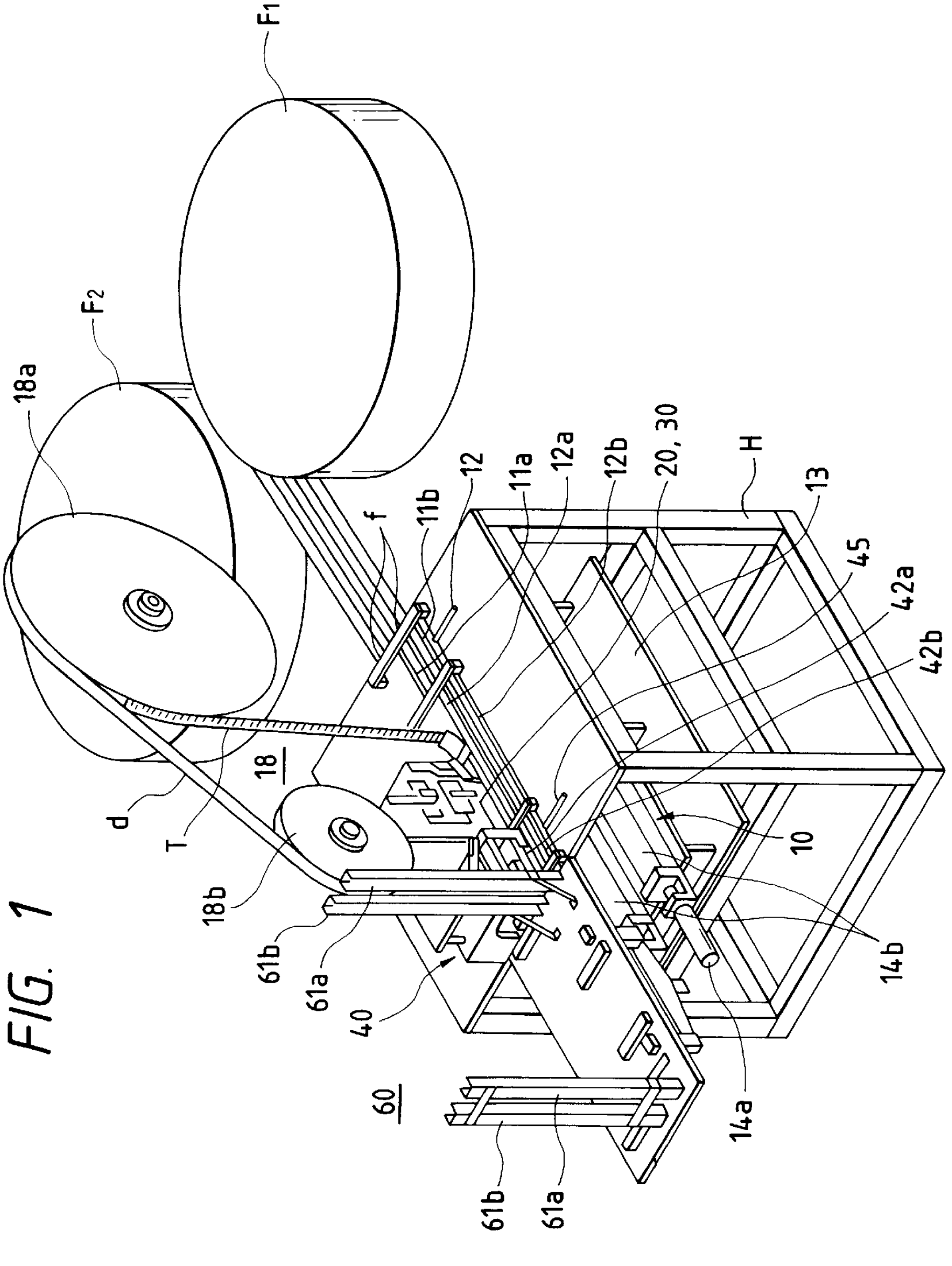
FIG. 1 is a perspective view of an embodiment of the invention.
Figure 2:
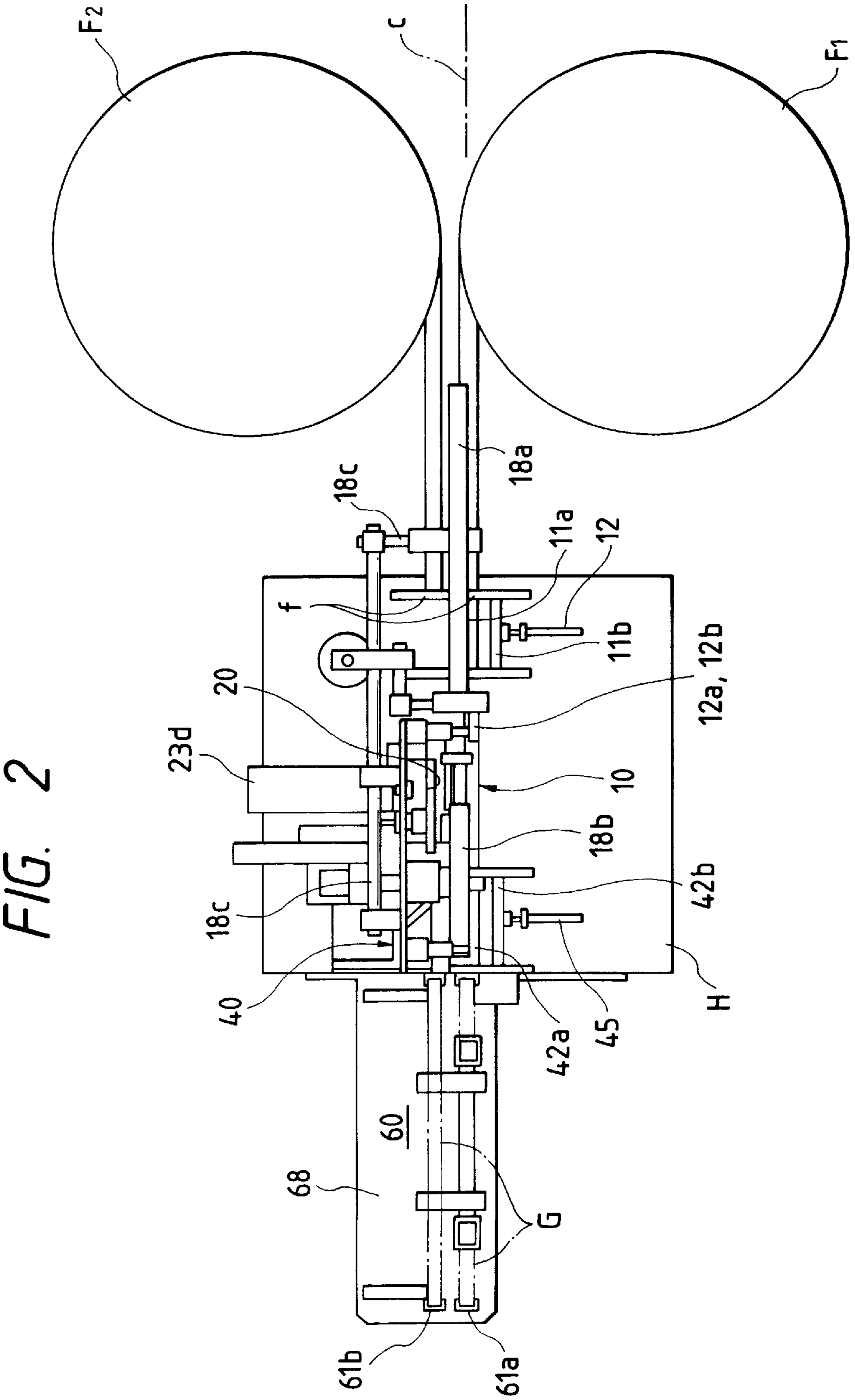
FIG. 2 is a plan view of an embodiment of the invention.
Figure 3:
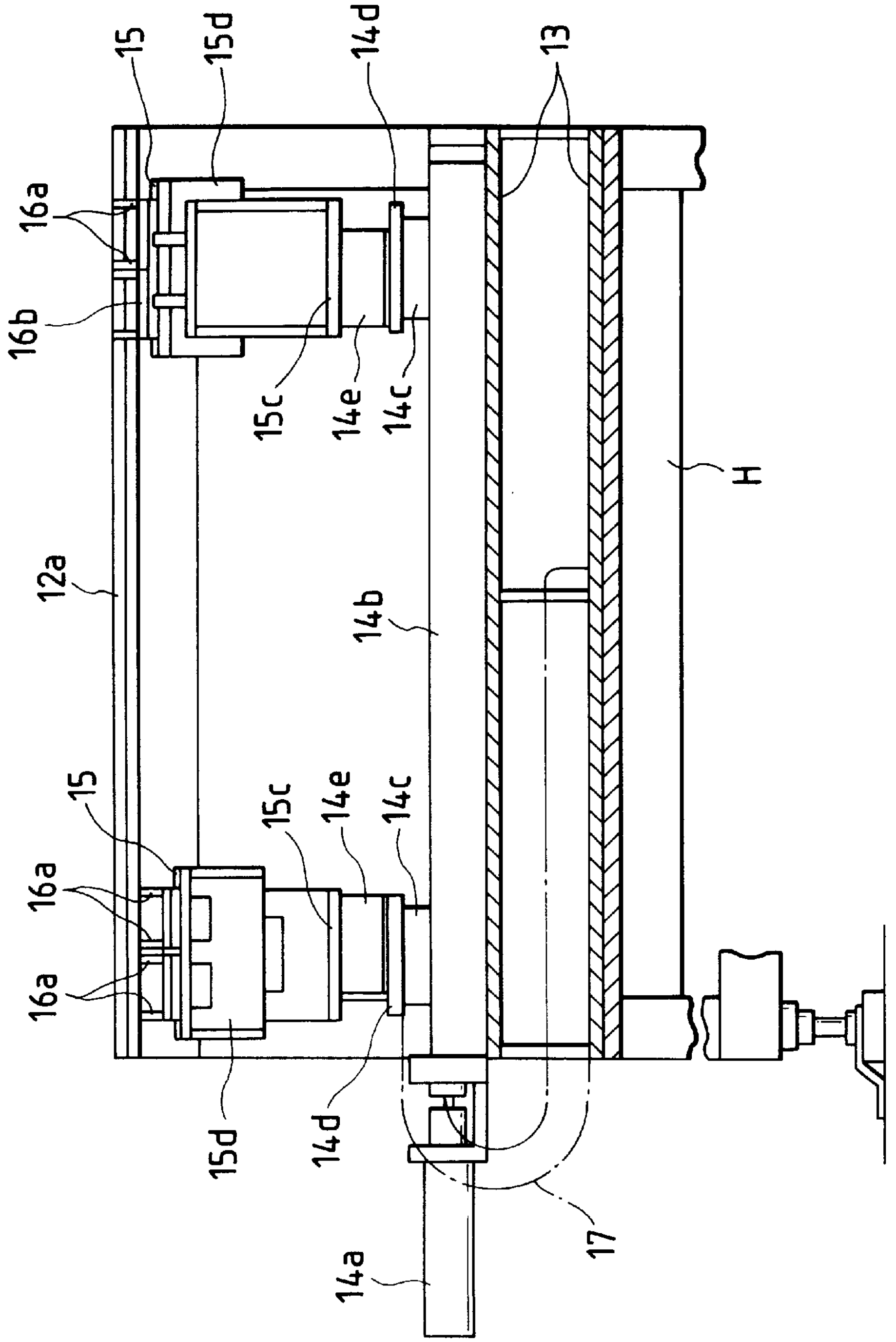
FIG. 3 is a front view of a connector housing conveying machine in an embodiment of the invention.
Figure 20A:
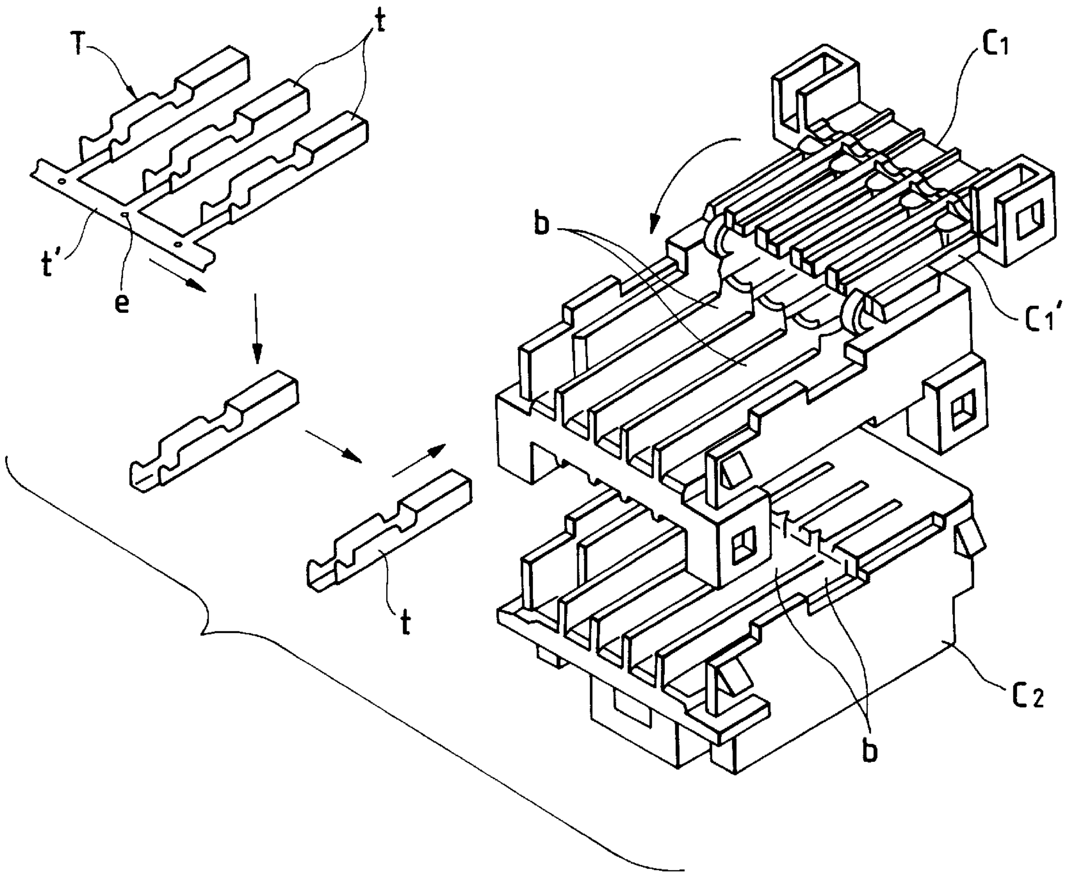
FIGS. 20(*a*) and 20(*b*) show a perspective view of a connector housing.
Figure 20B:
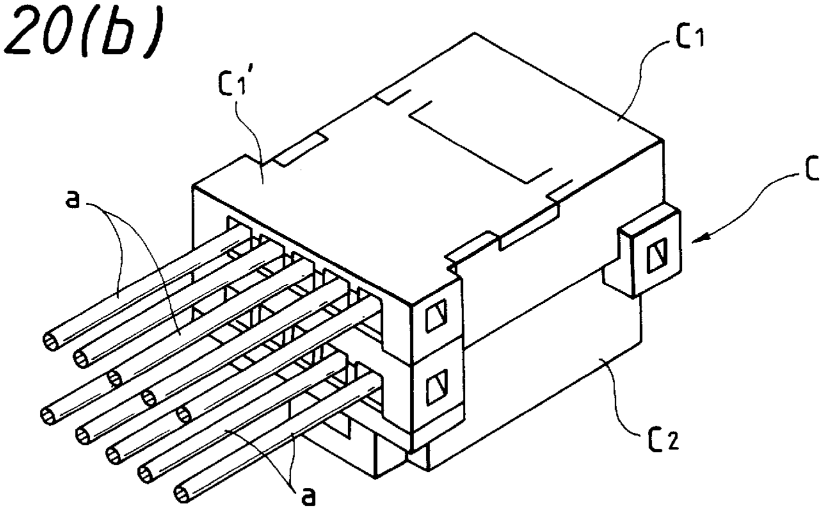

In a preferred embodiment of the invention, the crimp-style terminal t is mounted on a connector housing C ($C_1$, $C_2$), such as that shown in FIGS. 20(*a*) and 20(*b*). As shown in FIGS. 1 and 2, a device for mounting connector terminals in the preferred embodiment of the invention includes: a feeding and conveying machine 10 for conveying connector housings C; a terminal feeding machine 18; a terminal cutter 20 having means for individually setting a terminal cutting means and a terminal t to be cut at an inserting position in front of the terminal cavity b of the connector housing C; a terminal inserting machine 40 having means for inserting the terminal t into the cavity b; and an accommodating machine 60 having means for accommodating the connector housing C into which the terminal t has been inserted. The terminal feeding machine 18 and other portions of the device for mounting connector terminals are arranged on a machine frame H along the conveyance passage c of the feeding and conveying machine 10.

First, the feeding and conveying machine 10 for feeding and conveying connector housings C will be explained as follows. As shown in FIGS. 1 and 2, there are provided parts feeders $F_1$, and $F_2$, in which the respective housings $C_1$ and $C_2$ are accommodated, on both sides of the housing conveying passage c. Both feeders $F_1$ and $F_2$ can be moved in a longitudinal direction by a mechanism not shown in the drawing. Therefore, the feed port of each feeder selectively coincides with the conveying passage c. That is, one of the housings $C_1$ and $C_2$ is selectively sent out from the parts feeders $F_1$ and $F_2$. In the drawing, a housing $C_1$ is conveyed.

At the right end on the upper surface of the machine frame H, there are provided two guide rails 11*a*, 11*b* in such a manner that they can be simultaneously moved in the longitudinal direction. These guide rails 11*a*, 11*b* are selectively positioned above the conveyance passage c by the action of an air cylinder 12. Sections of these guide rails 11*a*, 11*b* are formed into a shape by which the conveyance position of the connector housings $C_1$ and $C_2$ can be corrected. That is, the guide rails 11*a* and 11*b* are formed so that the connector housings $C_1$ and $C_2$ are held in a desired position. The guide rails 11*a* and 11*b* can have a configuration similar to the portions g shown in FIGS. 19(*a*) and 19(*b*). Housings $C_1$ and $C_2$ sent from the feeders $F_1$ and $F_2$ are fed to the conveyance passage c while the housings are maintained in a predetermined position. The guide rail 11*a* corresponds to the housing $C_1$, and the guide rail 11*b* corresponds to the housing $C_2$.

Figure 10:
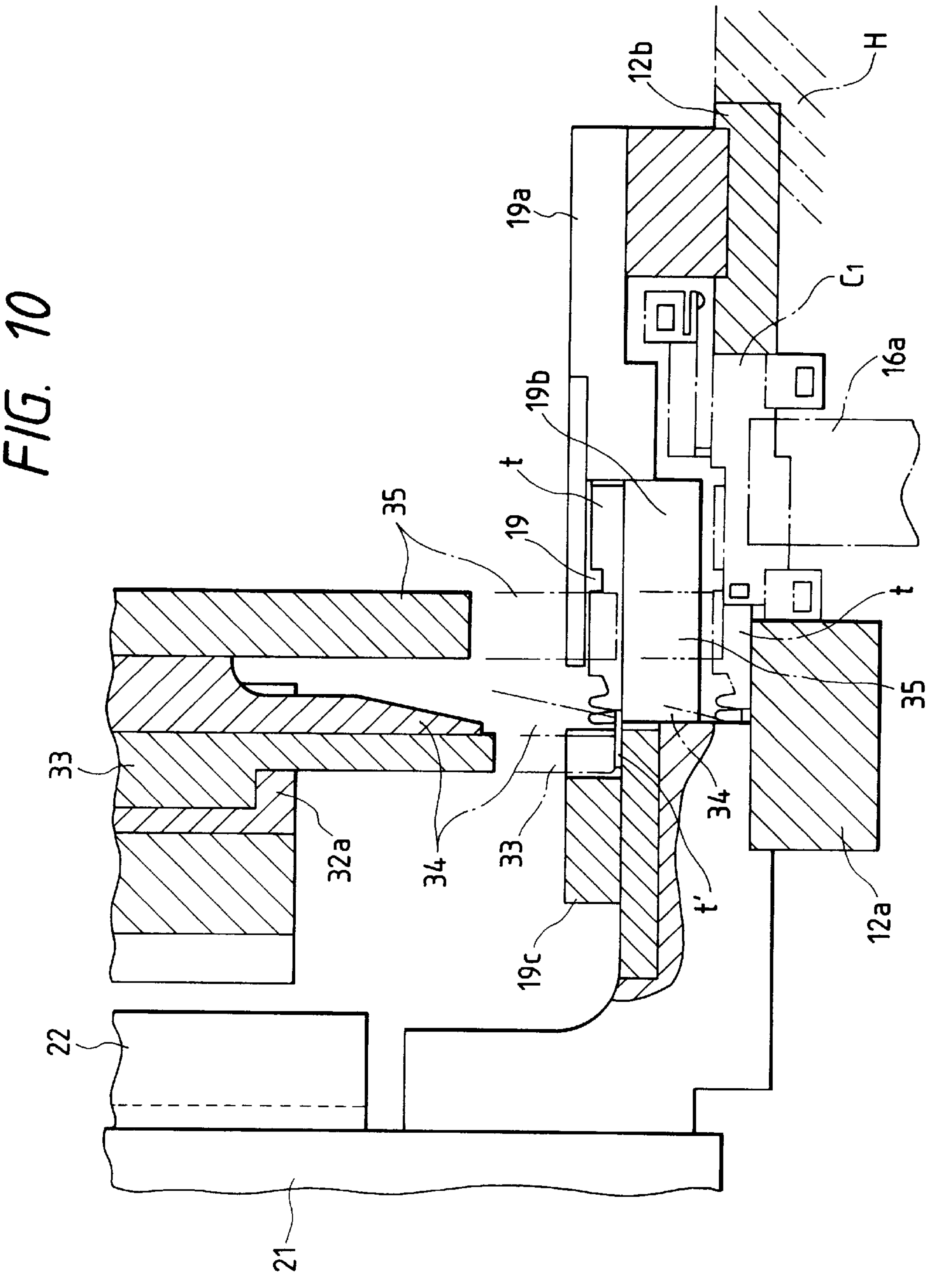
FIG. 10 is an enlarged cross-sectional view showing a primary portion of the terminal cutter.
Figure 11:
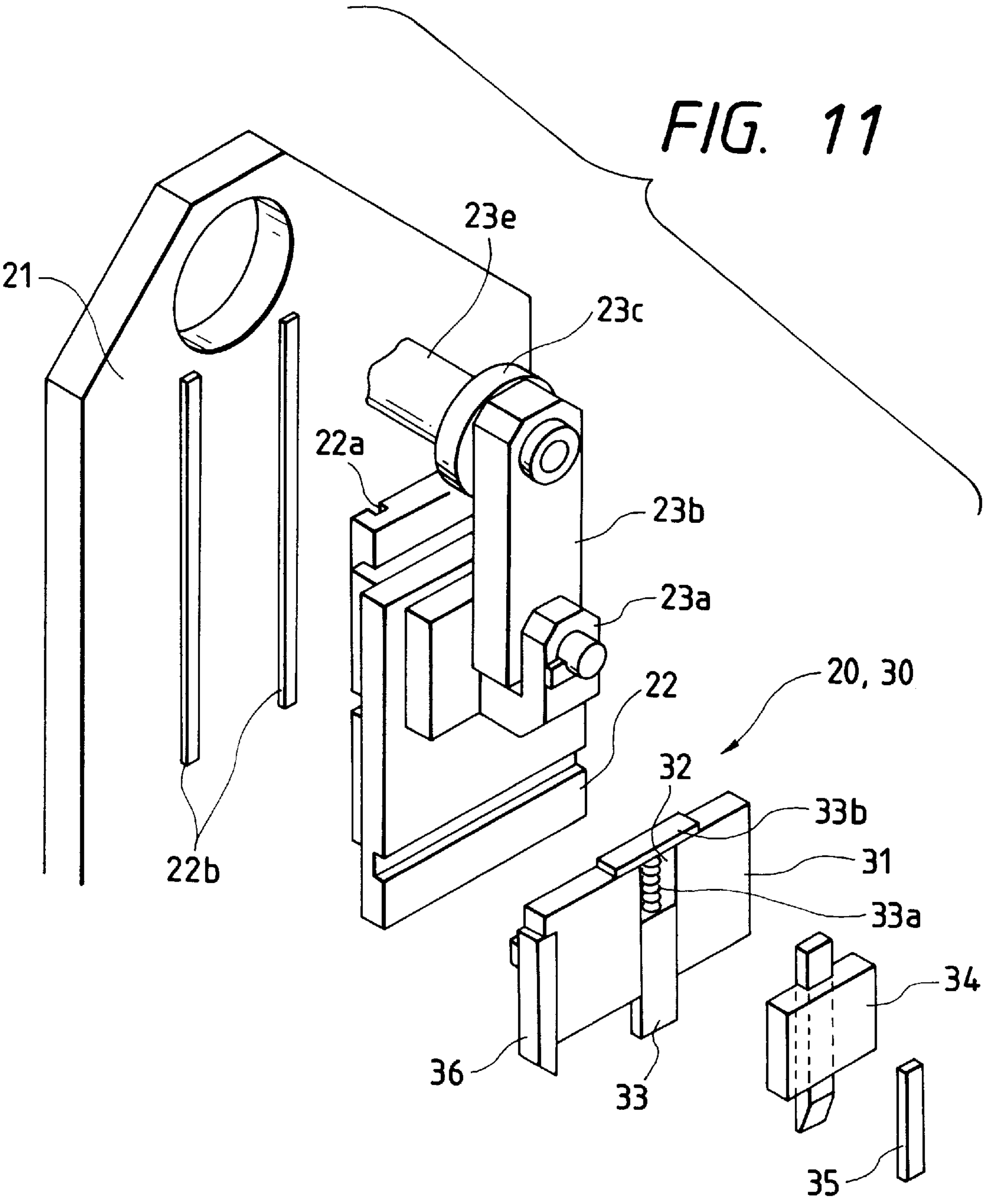
FIG. 11 is a exploded perspective view showing a primary portion of the terminal cutter.
Figure 12:
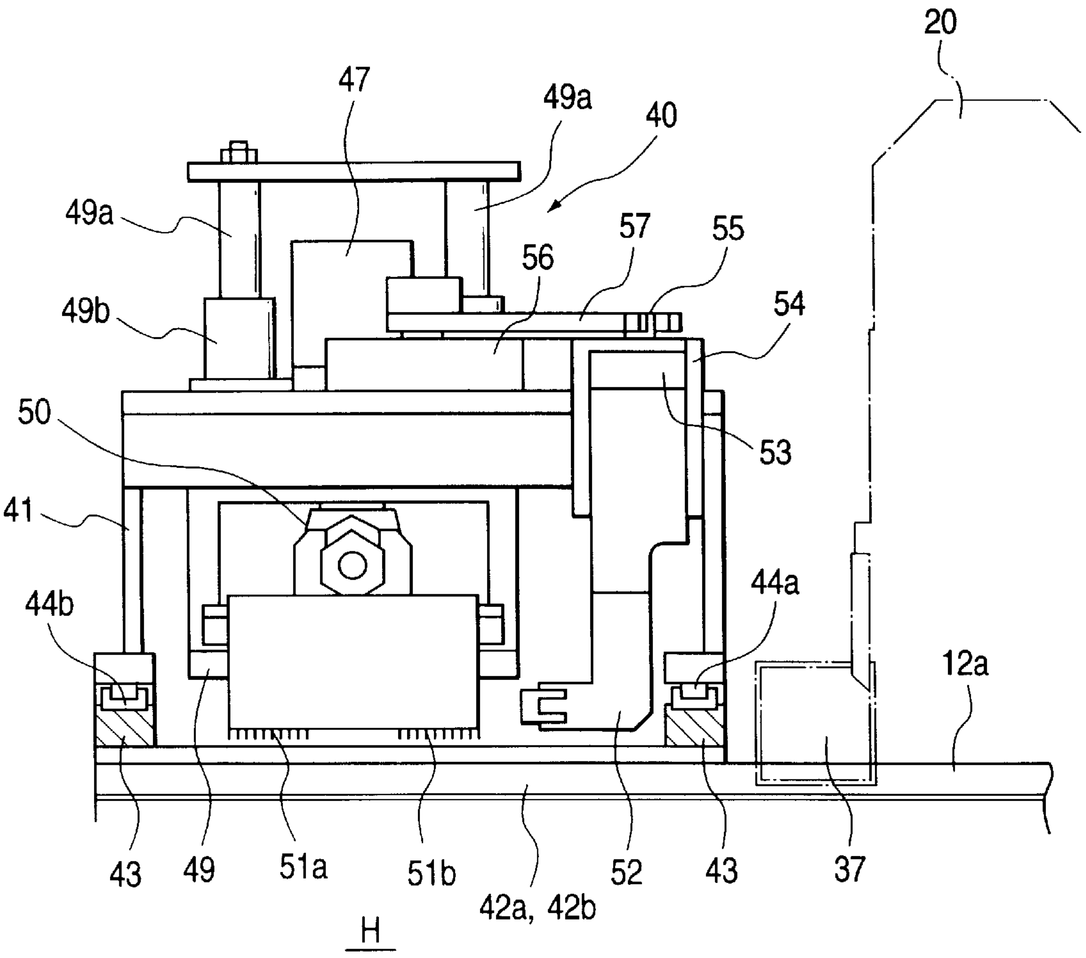
FIG. 12 is a front view of a terminal inserting machine of an embodiment of the invention.
Figure 13:
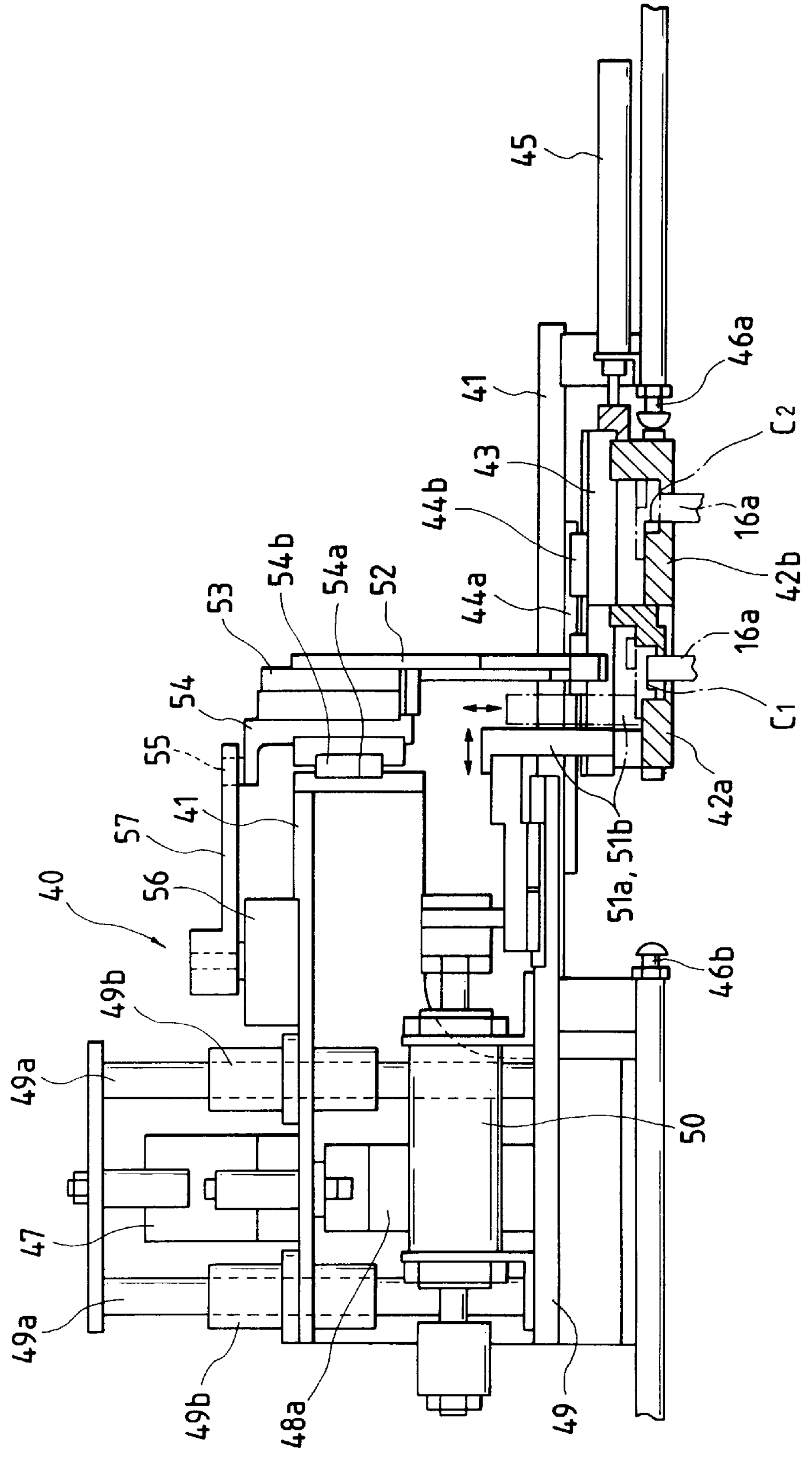
FIG. 13 is a left side view of the terminal inserting machine.

The conveyance passage c is composed of guides 12*a*, 12*b* provided in the base frame H in the transverse direction as shown in FIG. 10. Housings $C_1$ and $C_2$ are moved between these guides 12*a*, 12*b* while being guided by the guides 11*a*, 11*b* in a predetermined position. A movement of the housings $C_1$ and $C_2$ is performed by the feeding and conveying machine 10.

As shown in FIGS. 3 to 6, the feeding and conveying machine 10 is composed as follows. There is provided a base 13 in the middle of the machine frame H, and this base 13 extends in the transverse direction over all length of the machine frame H. On the base 13, there are provided two sets of ball and screw devices 14*b*, 14*b* driven by servo motors 14*a*, 14*a*, wherein these ball and screw devices 14*b*, 14*b* are arranged on both sides of the conveyance passage c. Moving tables 14*c*, 14*c* each have a chuck mechanism respectively attached to end caps of the ball and screw devices 14*b*, 14*b*. Accordingly, when the ball and screw device 14*b* is rotated by the servo motor 14*a*, the chuck mechanism is moved in the transverse direction with high accuracy. This movement of the chuck mechanism is made in accordance with the conveyance interval of cutting and inserting a terminal, which will be described later.

The chuck mechanism is composed as follows. A pair of moving bodies 16*b* having a chuck claw 16*a* are arranged on a chuck table 15 in such a manner that the moving bodies 16*b* can be freely moved in the transverse direction being guided by the guides 16*c*. The moving body 16*b* is engaged with a pinion 15*a* of a rack 16*d*. When this pinion 15*a* is rotated by a rotary actuator 15*b*, the chuck claw 16*a* comes into contact with the housing C. In this way, the housing C can be held by the chuck claws 16*a*. When these chuck claws 16*a*, 16*a* come into contact with the housing C so as to hold it, the holding distance between both chuck claws 16*a* to hold the housing C is not limited. Therefore, it is possible to hold housings C of various sizes, that is, it is possible to hold various housings C, that have different numbers of poles. The reason why there are provided two sets of chucks on one chuck table 15 is that this mechanism holds both housings $C_1$ and $C_2$.

Figure 4:
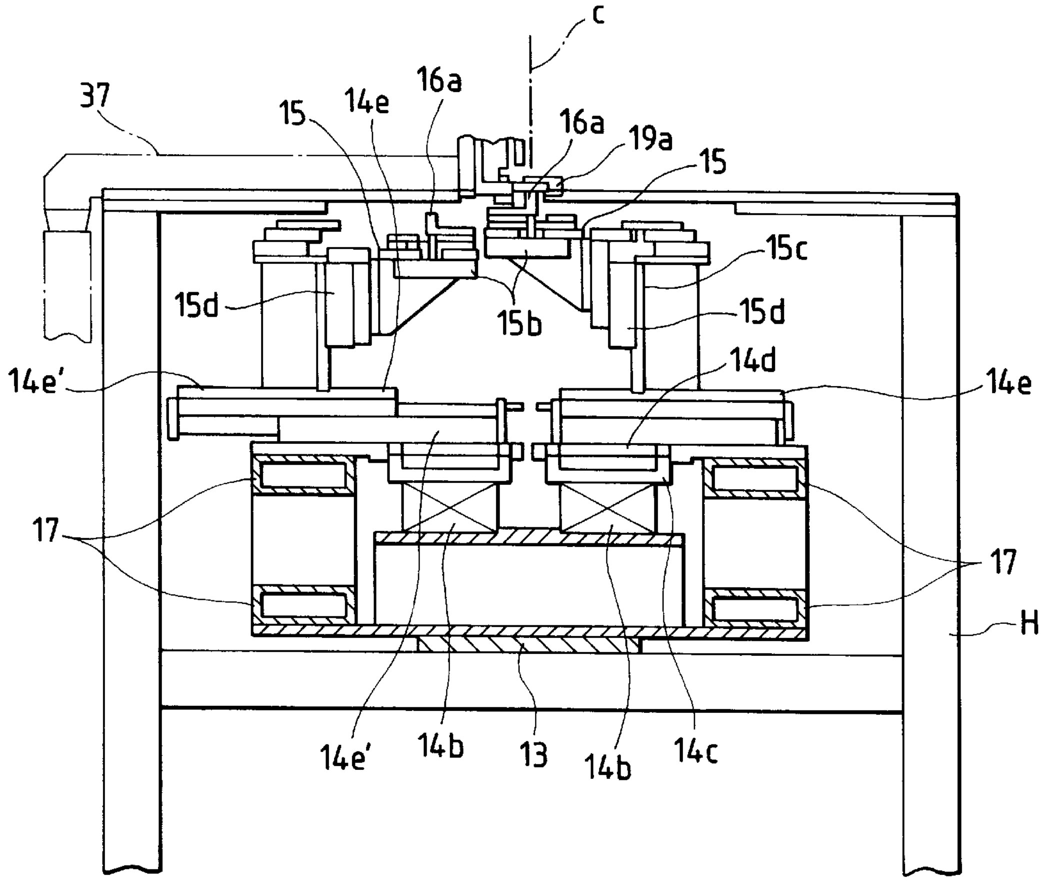
FIG. 4 is a partially cutaway enlarged left side view of the connector housing conveying machine.
Figure 5:
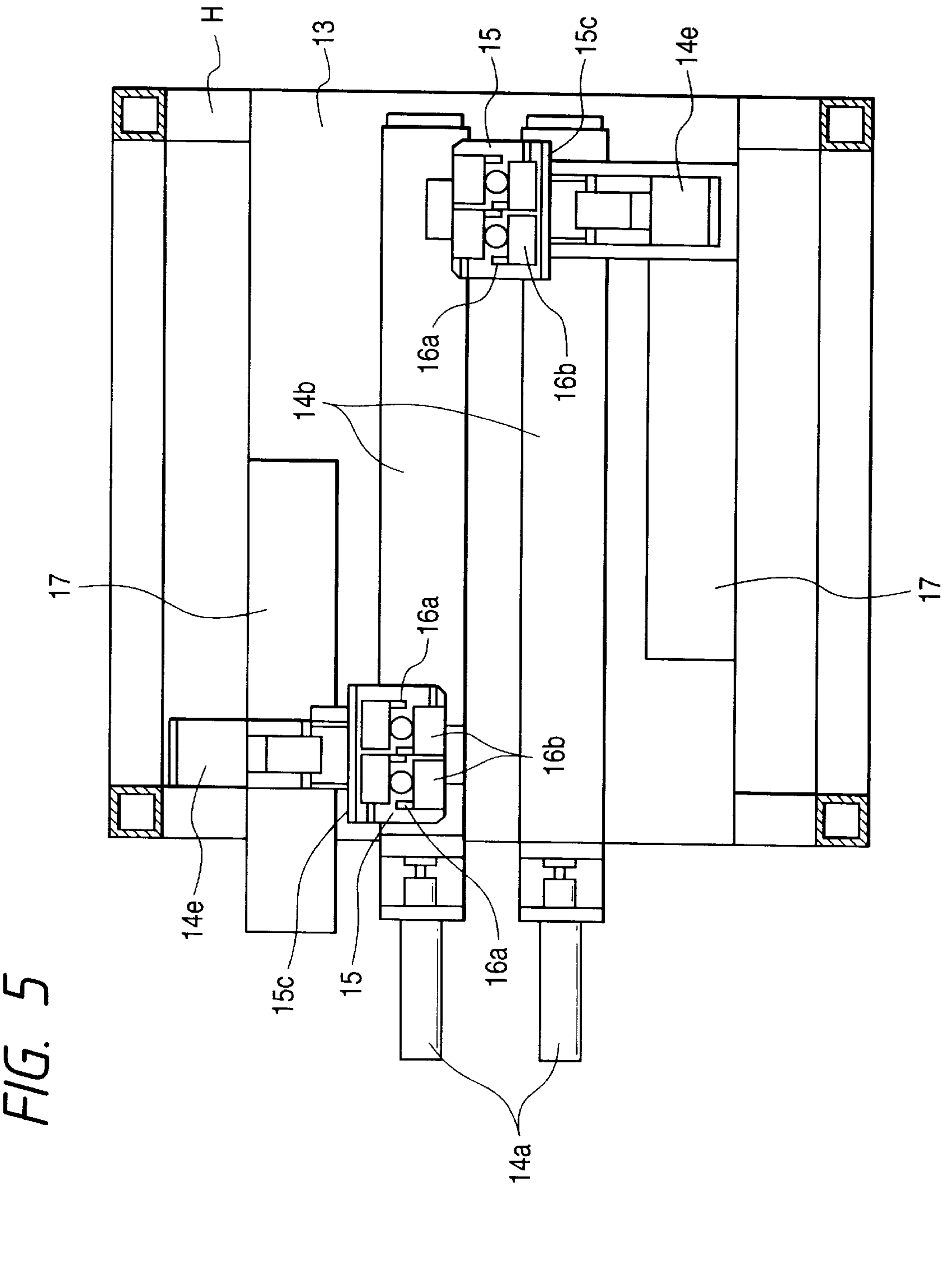
FIG. 5 is a plan view of the connector housing conveying machine.
Figure 6:
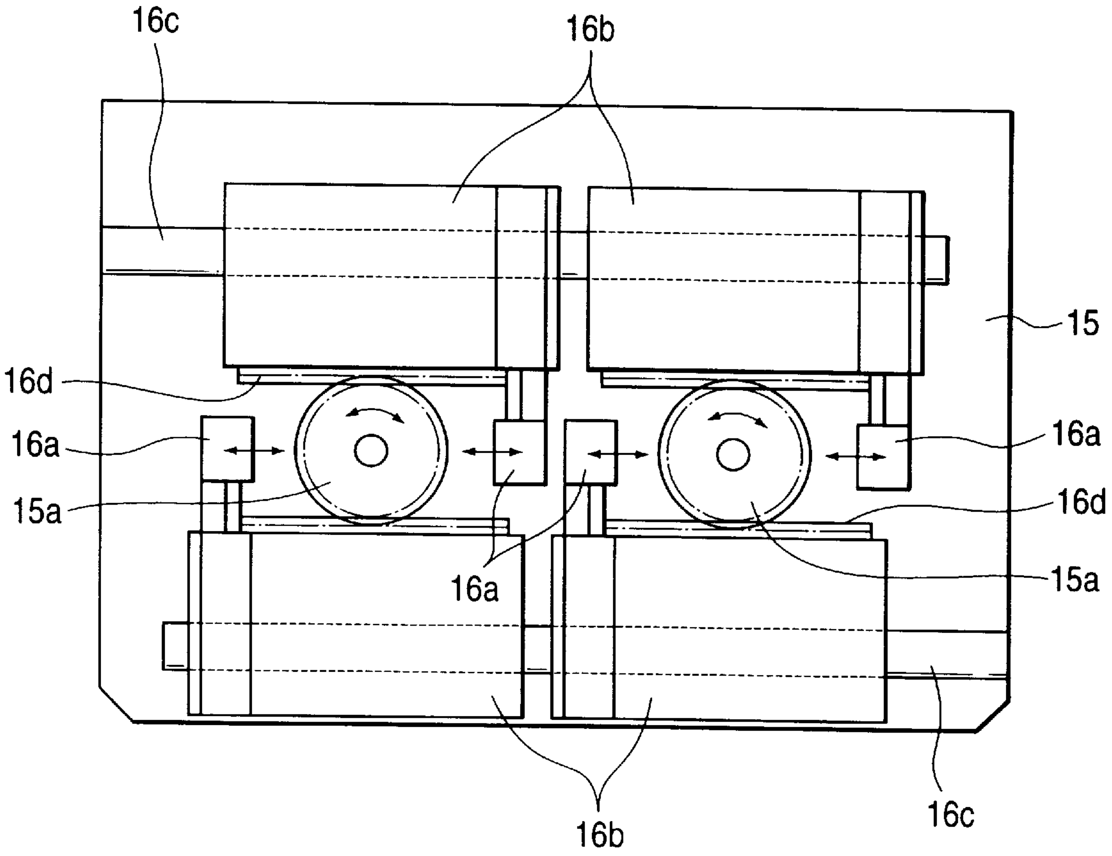
FIG. 6 is an enlarged plan view showing a chuck section of the connector housing conveying machine.
Figure 7:
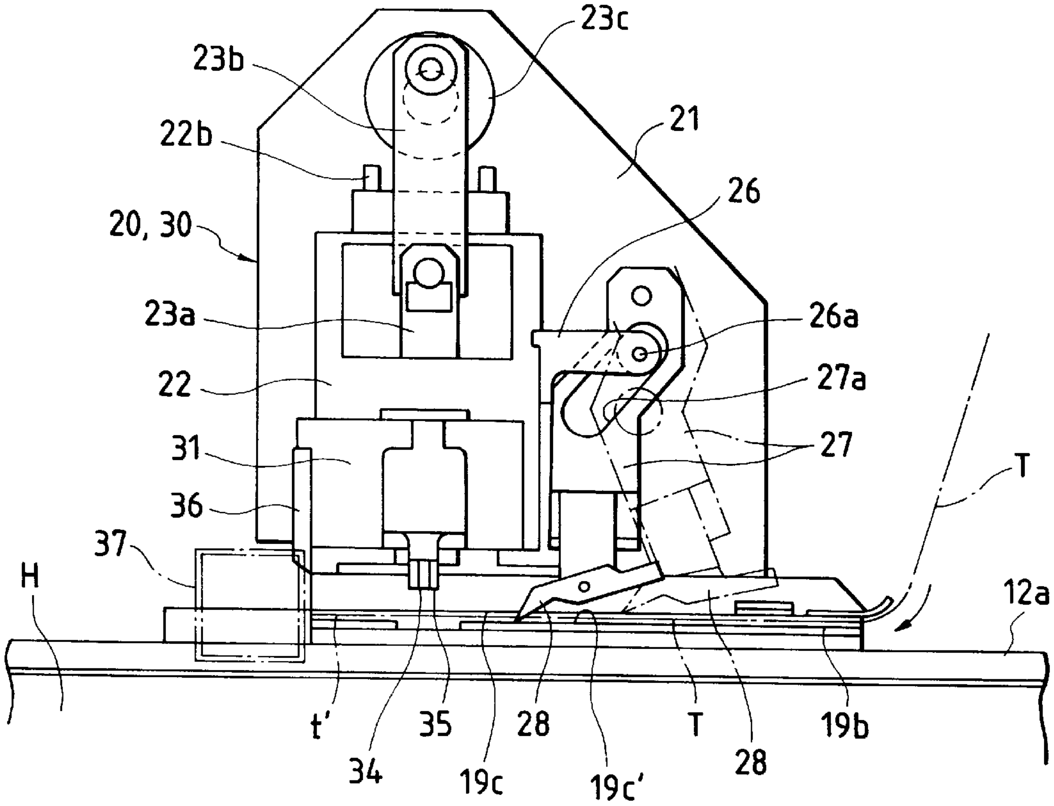
FIG. 7 is a front view of a terminal cutter of an embodiment of the invention.
Figure 8:
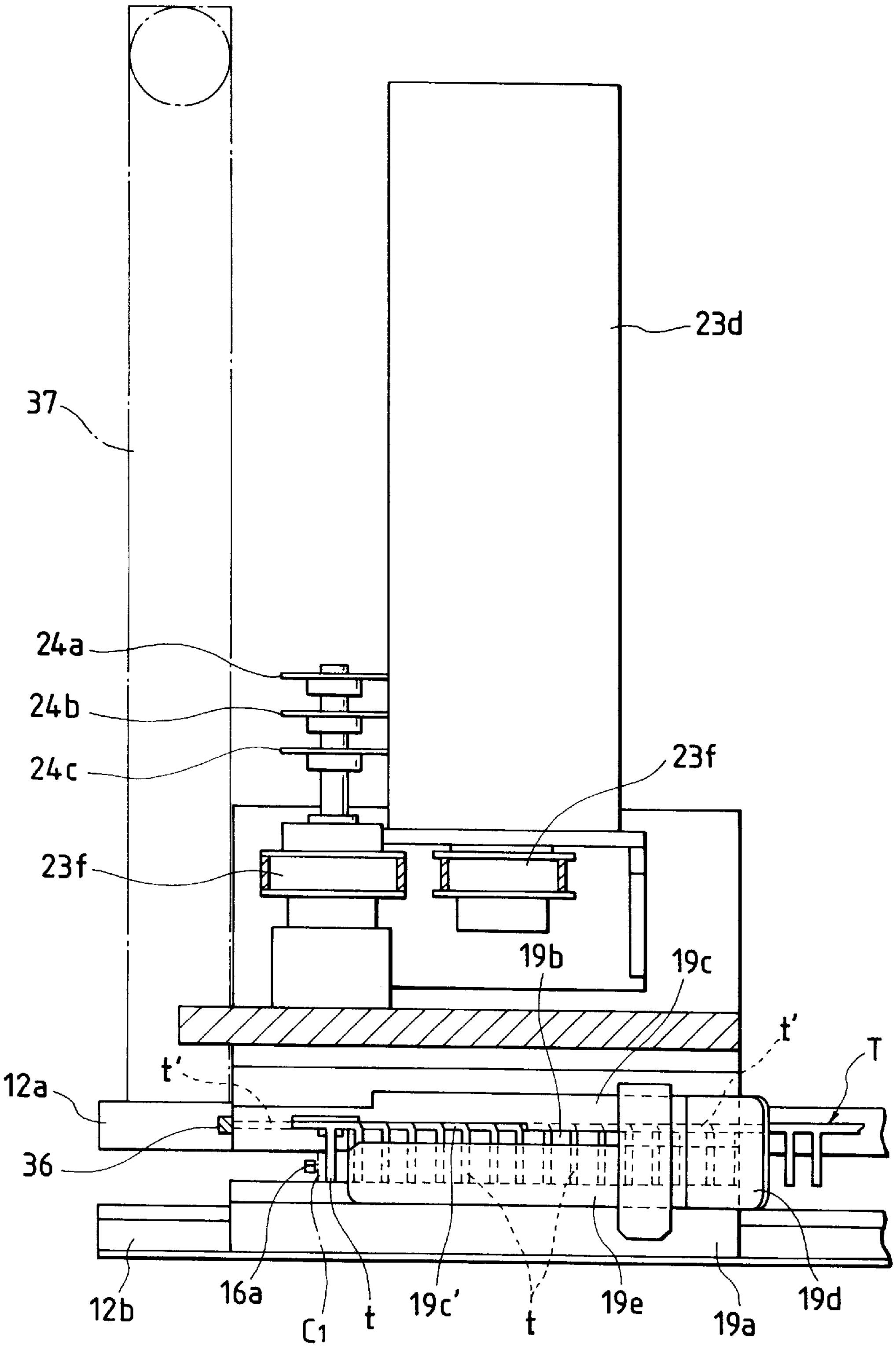
FIG. 8 is a plan view of the terminal cutter.
Figure 9:
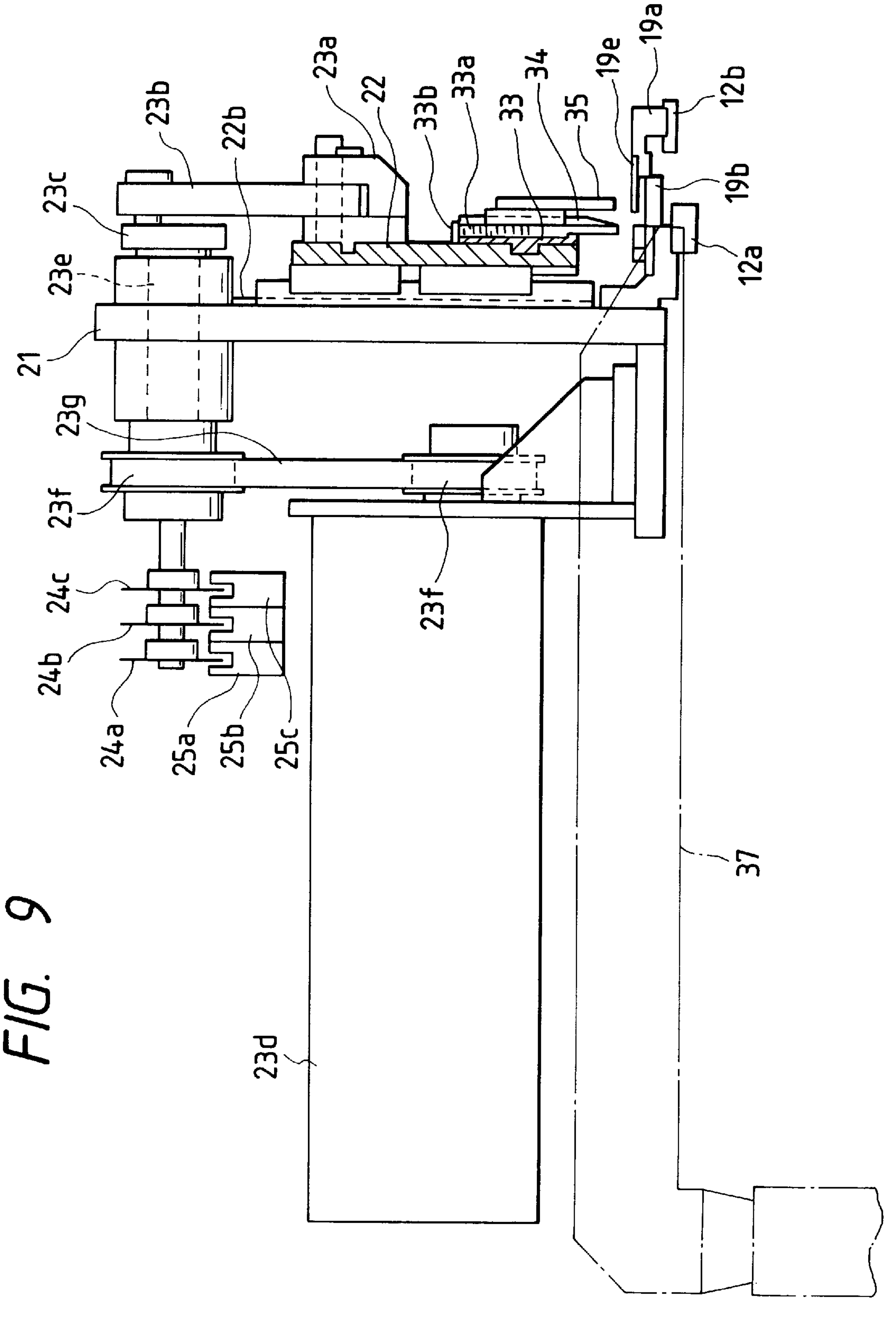
FIG. 9 is a left side view of the terminal cutter.

The chuck table 15 is mounted on the moving table 14*c* via the base plate 14*d*, air sliding table 14*e*, plate 15*c* and air sliding table 15*d*. In this case, the air sliding table 14*e* is fixed to the moving table 14*c* via the base plate 14*d*, and the plate 15*c* is fixed to the air sliding table 14*e*, and the air sliding table 15*d* is fixed to the plate 15*c*. Both air sliding tables 14*e*, 15*d* are composed in such a manner that sheet-shaped members, which are opposed to each other, are extended and retracted when compressed air is sucked and exhausted (shown by reference numerals 14*e*', 14*e*'in FIG. 4). Therefore, when the air sliding tables 14*e*, 15*d* are extended and retracted, the chuck table 15 can be moved into one of two states, as shown in FIG. 4. One is a state (conveying state) in which the chuck claw 16*a* is located at a position in the conveyance passage c where the chuck claw 16*a* can hold the housing C, and the other is a state (retracting state) in which the chuck claw 16*a* is separated from the conveyance passage c and retracted backward. Accordingly, as shown in FIG. 5, it is possible for these two sets of chuck mechanisms to convey the housings C alternately in such a manner that one chuck mechanism conveys one housing C and the other chuck mechanism returns to the start point to start conveyance of another housing C. Thus, it becomes possible to continuously insert the terminals t into connector housings C. In the drawing, reference numeral 17 is a runner flexible tube for supplying compressed air to the rotary actuator 15*b* and air sliding tables 14*e*, 15*d*.

The terminal feeding machine 18 is composed of a reel 18*a* around which the terminal hoop T is wound, and a winding reel 18*b* for winding paper d which is interposed between the winding layers of the terminal hoop T. Both reels 18*a*, 18*b* are supported by the machine frame H via the arm 18*c*. After paper d has been peeled off, the terminal hoop T (terminal band) is introduced from the reel 18*a* to the terminal cutter 20.

As shown in FIG. 10, the guides 12*a*, 12*b* have guide plates 19*a*, 19*b*, 19*c* directly attached to the guides 12*a*, 12*b* to guide the terminal band T. The guide plates 19*a*, 19*b* and 19*c* can also be attached so that some clearance is provided between the guide plates 19*a*, 19*b* and 19*c* and the guides 12*a* and 12*b*. The terminal band T is introduced into the passage 19 formed by these guide plates 19*a*, 19*b*, 19*c* via the guide plate 19*d*. At this time, most of the terminals t are guided while the intermediate guide plate 19*b* is moved and the outer guide plate 19*a* guides an end portion of the terminal t and the inner guide plate 19*c* guides a band portion t'(shown in FIG. 10).

As shown in FIGS. 7 to 11, the terminal cutter 20 is composed as follows. There is provided a moving body 22 on a base plate 21 which is perpendicularly arranged on the machine frame H. This moving body 22 can be freely moved upward and downward via a groove 22*a* and protrusion 22*b*. A hook-shaped clamp 23*a* is fixed to this moving body 22.

A crank 23*b* is rotatably connected with the clamp 23*a*. The crank 23*b* is connected with a rotary plate 23*c* in such a manner that the crank 23*b* can be eccentrically rotated with respect to the rotary plate 23*c*.

The rotary plate 23*c* is fixed to a shaft 23*e* rotated by a motor 23*d* having a clutch brake, via pulleys 23*f* and a belt 23*g*. When the rotary plate 23*c* is rotated by the motor 23*d*, the moving body 22 is moved upward and downward via the crank 23*b* and clamp 23*a*. The upper and the lower limit of the movement of the moving body 22 are detected by the cooperation of the detection disks 24*a*, 24*b* fixed to the shaft 23*e* with the photo-micro-switches 25*a*, 25*b*, 25*c*. In this case, the detection disk 24*a* and the photo-micro-switch 25*a* are used for detecting the upper limit, and the detection disk 24*b* and the photo-micro-switch 25*b* are used for starting the feed of the terminal t, and the detection disk 24*c* and the photo-micro-switch 25*c* are used for detecting the lower limit.

There is provided an arm 26 on the side of the moving body 22. A sliding pin 26*a* protrudes from this arm 26. This sliding pin 26*a* is engaged with a long hole 27*a*, which is formed on an oscillating plate 27 capable of freely oscillating with respect to the base plate 21, via an idler. Therefore, in accordance with the movement of the moving body 22 which is moved upward and downward, the sliding pin 26*a* moves in the long hole 27*a*, so that the oscillating plate 27 oscillates between a state shown by a solid line in FIG. 7 to a state shown by a dashed line in FIG. 7. At the lower end of the oscillating plate 27, there is provided a feeding claw 28, the front end portion of which is biased downward by the action of a spring not shown in the drawing. When the feeding claw 28 is moved from the solid line state to the dashed line state by the oscillation of the oscillating plate 27, and further when the feeding claw 28 is moved from the dashed line state to the solid line state, the terminal band T is fed forward at the intervals of the terminals t.

The terminal band T introduced by the above guide plates 19*a*, 19*b*, 19*c* is sent forward while an upper surface of the terminal band T is restricted by a pushing plate 19*e*. On the other hand, an upper surface portion of the inner guide plate 19*c* which covers the band portion t' of the terminal band T is formed into an inclined surface from the middle portion, so that the upper surface portion of the inner guide plate 19*c* is missing from the middle portion. This missing portion corresponds to an area where the feeding claw 28 moves. Therefore, in accordance with the aforementioned movement, the feeding claw 28 ascends and descends the inclined surface 19*c*' and then enters the missing portion. Then, the feeding claw 28 engages with a feeding hole e formed in the band section t' (shown in FIG. 20), and the terminal band T is fed by one pitch of the holes e. Accordingly, when the moving body 22 is once moved upward and downward, the terminal band T is fed by one pitch.

The above moving body 22 includes a means 30 for cutting the terminal t and setting it in the connector housing C. That is, a base plate 31 is fixed to the moving body 22, and a groove 32 is formed on the front surface of the base plate 31 in the upward and downward direction. A pushing member 33 slidably engages with the groove 32 and is biased downward by the action of a spring 33*a*. This pushing member 33 comes into contact with a protrusion 32*a* at the lower end of the groove 32, so that the pushing member 33 can not extend from the base plate 31 more than a predetermined amount (shown in FIG. 10). Reference numeral 33*b* shown in the drawing is a spring presser.

Attached to the front surface of the base plate 31 is a cutting blade 34 for cutting off the terminal t. On the front surface of the cutting blade 34, there is provided a terminal presser 35. When the moving body 22 is lowered, as shown by the dashed line in FIG. 10, the pushing member 33 contacts the band section t', and then the cutting blade 34 and the terminal presser 35 are lowered, so that the terminal t'is cut off from the band section t', and at the same time, pushed downward to an inserting position in front of the cavity b of the connector housing C, so that the terminal t is engaged with the cavity b. After the completion of engagement, the connector housing C is moved forward at the interval of the cavity b by the feeding and conveying machine 10. On the other hand, the moving body 22 is elevated, and the terminal t is set at an inserting position in front of the next cavity b. At this time, when there is a cavity b into which the terminal t is not inserted, the connector housing C is moved forward by the pitch of a vacant cavity b. That is, it is possible to obtain a connector having the vacant cavity b.

On the left side of the moving body 22, there is provided a cutting blade 36 for cutting off the band section t'. When the band section t' is moved to a position below this cutting blade 36, it is cut by the blade 36 when the blade 36 is lowered. The chip generated by this cutting operation is removed by a suction hose 37. After the predetermined terminals t have been set in the housing $C_1$, the housing $C_1$ is sent to the successive terminal inserting machine 40.

As shown in FIGS. 12 to 15, this terminal inserting machine 40 is composed as follows. There is provided a base frame 41 in the machine frame H. On the front side of this base frame 41, there are provided guide rails 42*a*, 42*b*, the construction of which is the same as that of the guide rails 11*a*, 11*b* described before. Both end portions of the guide rails 42*a*, 42*b* are supported by the members 43. The guide rails 42*a*, 42*b* are moved in the longitudinal direction by the air cylinder 45 via the guide 44*a* and slider 44*b* which are fixed to the base plate 41, so that the guide rails 42*a*, 42*b* are alternately positioned in the conveyance passage c.

An air cylinder 47 is fixed to the base frame 41, and an elevating plate 49 is fixed to the piston rod of this cylinder 47 via a floating joint 48*a*. This elevating plate 49 is maintained to be horizontal with respect to the base frame 41 via the elevating shaft 49*a* and bearing 49*b*. This elevating plate 49 can be freely elevated while it is maintained to be horizontal. That is, the elevating plate 49 is elevated by the cylinder 47.

The elevating plate 49 is provided with an air cylinder 50. A piston rod of the air cylinder 50 is attached to the inserting blades 51*a*, 51*b* which are arranged in the transverse direction (shown in FIG. 12). The inserting blades 51*a*, 51*b* are composed in such a manner that comb teeth arranged at the lower ends of the inserting blades 51*a*, 51*b* are opposed to a groove of the cavity b of the housing C. The inserting blades 51*a*, 51*b* are lowered from a state shown by a solid line to a state shown by a dashed line in FIG. 13 when the elevating plate 49 is lowered by the cylinder 47, and the inserting blades 51*a*, 51*b* are pushed forward by the cylinder 50. Terminals t which have been set at inserting positions in front of the cavities b of the housing C are inserted and mounted in the cavities b. The two inserting blades 51*a*, 51*b* correspond to both housings $C_1$ and $C_2$.

On the front surface of the base frame 41, there is provided an arm 52 for transferring the housing C after the terminals have been mounted, wherein the arm 52 for transferring the housing C is arranged via the air sliding table 53 and the horizontal moving plate 54 in such a manner that it can be freely moved in the transverse direction. The horizontal moving plate 54 is moved while the sliding member 54*b* is engaged with the groove 54*a* of the base frame 41. The air sliding table 53 is positioned in the conveyance passage c when a lower end of the arm 52 is lowered from a retracting position (shown by a solid line in FIG. 15) to a state shown by a dashed line.

Figure 14:
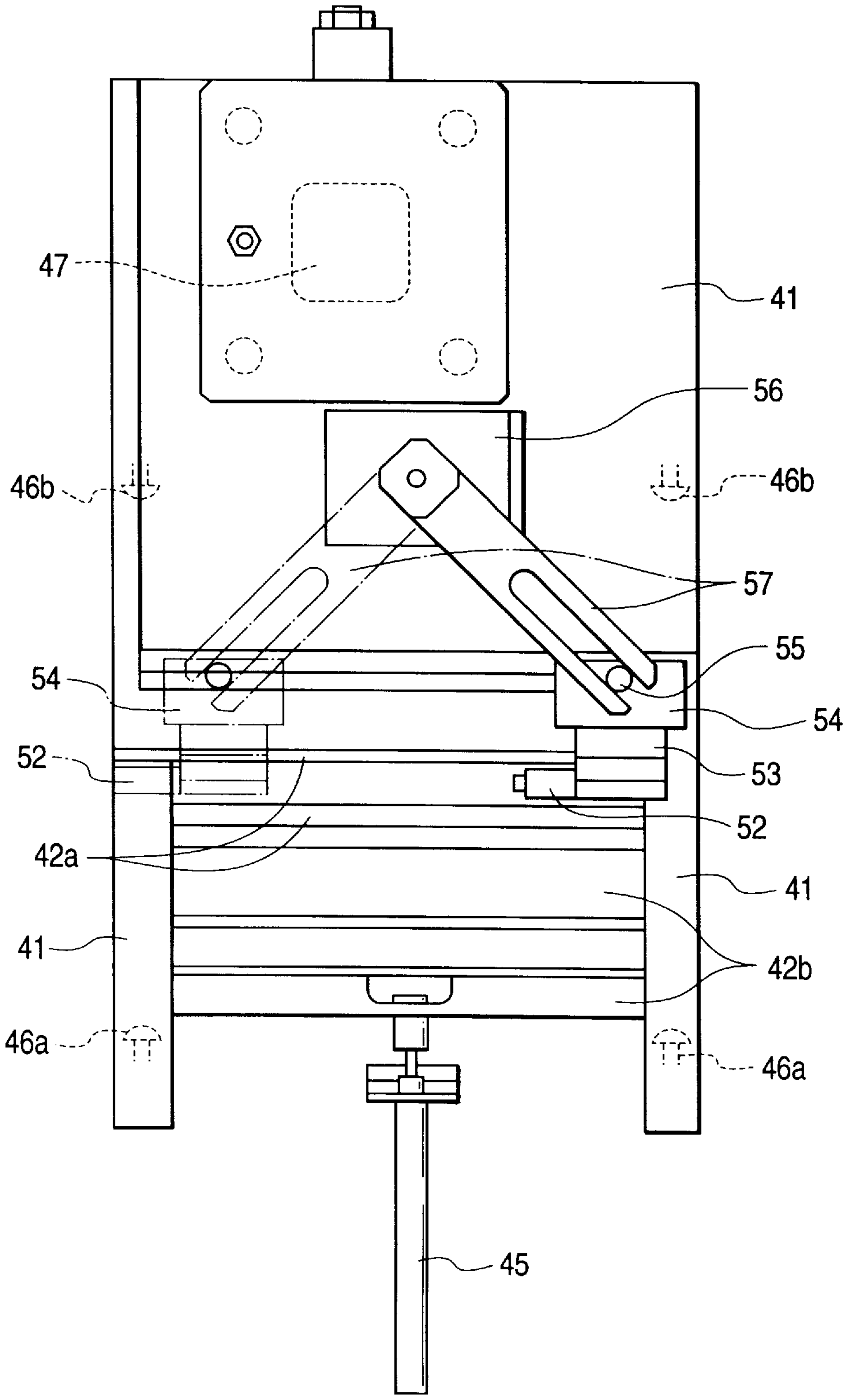
FIG. 14 is a plan view of the terminal inserting machine.
Figure 15:
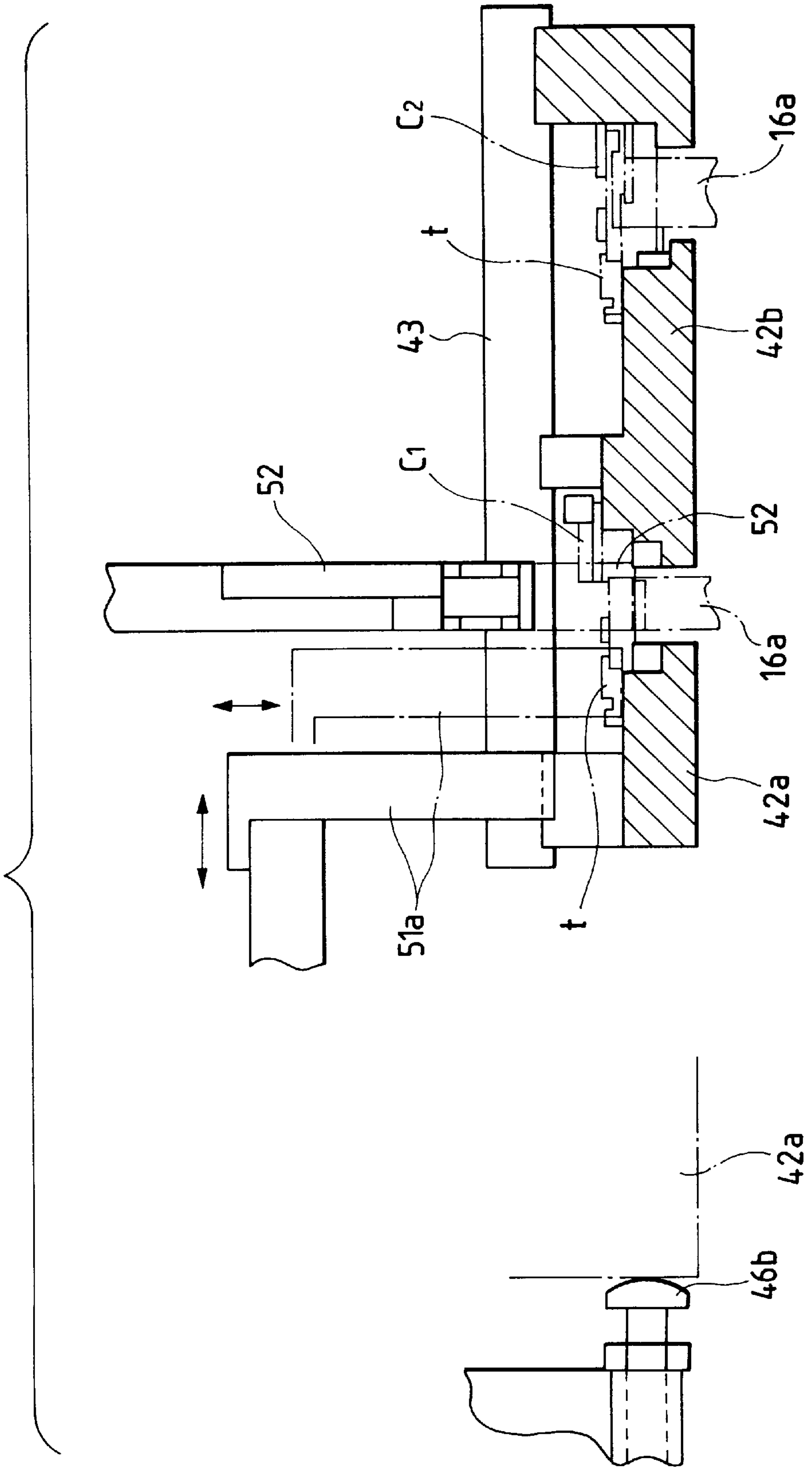
FIG. 15 is an enlarged cross-sectional view of a primary portion of the terminal inserting machine.

A pin 55 arranged at an upper end of the horizontal moving body 54 is engaged with a yoke arm 57 rotated by a rotary actuator 56 arranged on the base frame 41. When the arm 57 is rotated by the rotary actuator 56, the feeding arm 52 is moved in the transverse direction from a state shown by a solid line to a state shown by a dashed line as shown in FIG. 14. When the feeding arm 52 lower end portion is located above the conveyance passage c, the housing C in which the terminals t have already been mounted is transferred by the arm 52 to the accommodating machine 60.

Figure 16:
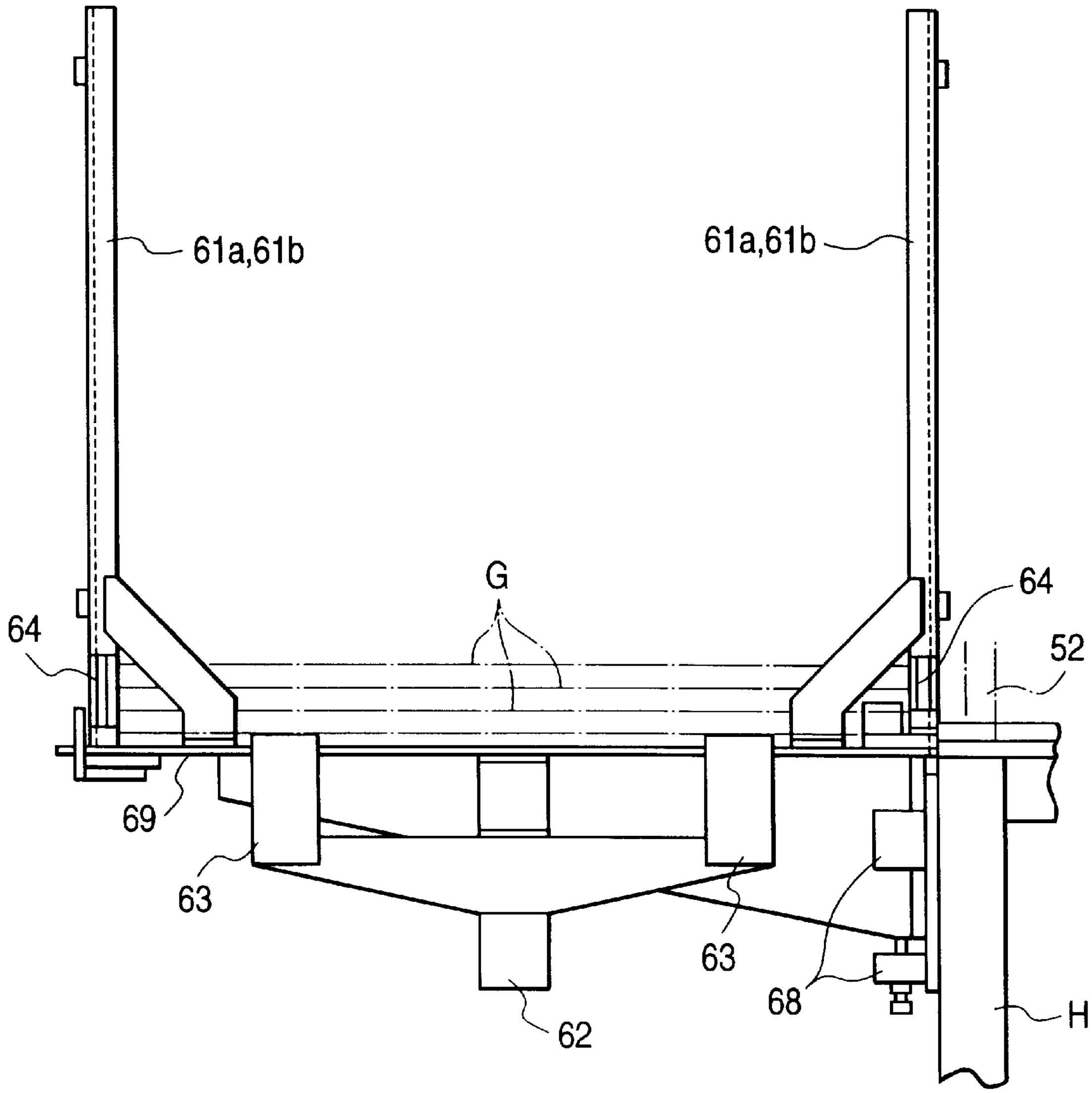
FIG. 16 is a front view of a connector housing accommodating machine of an embodiment of the invention.
Figure 17:
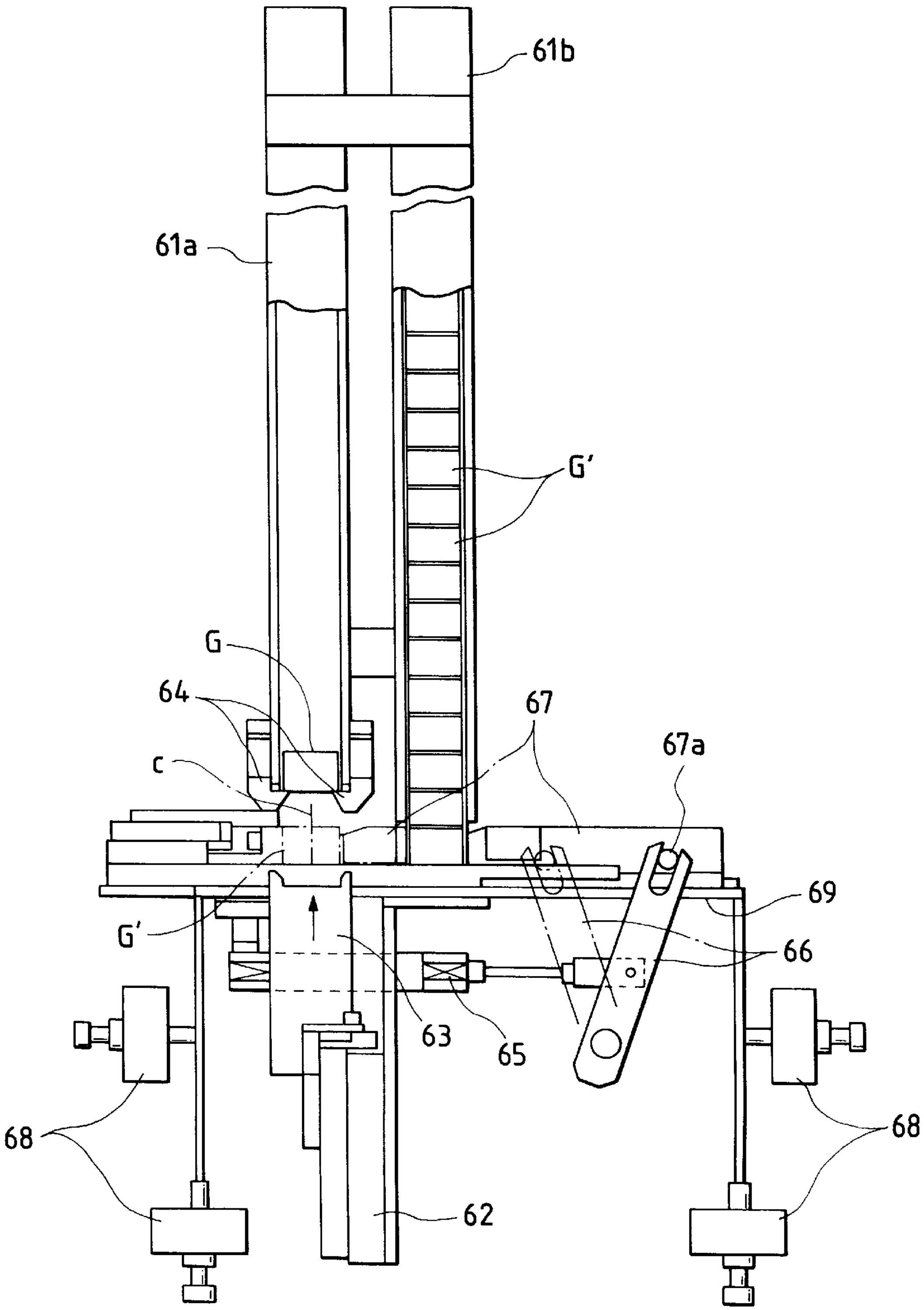
FIG. 17 is a partially cutaway right side view of the connector housing accommodating machine.
Figure 18:
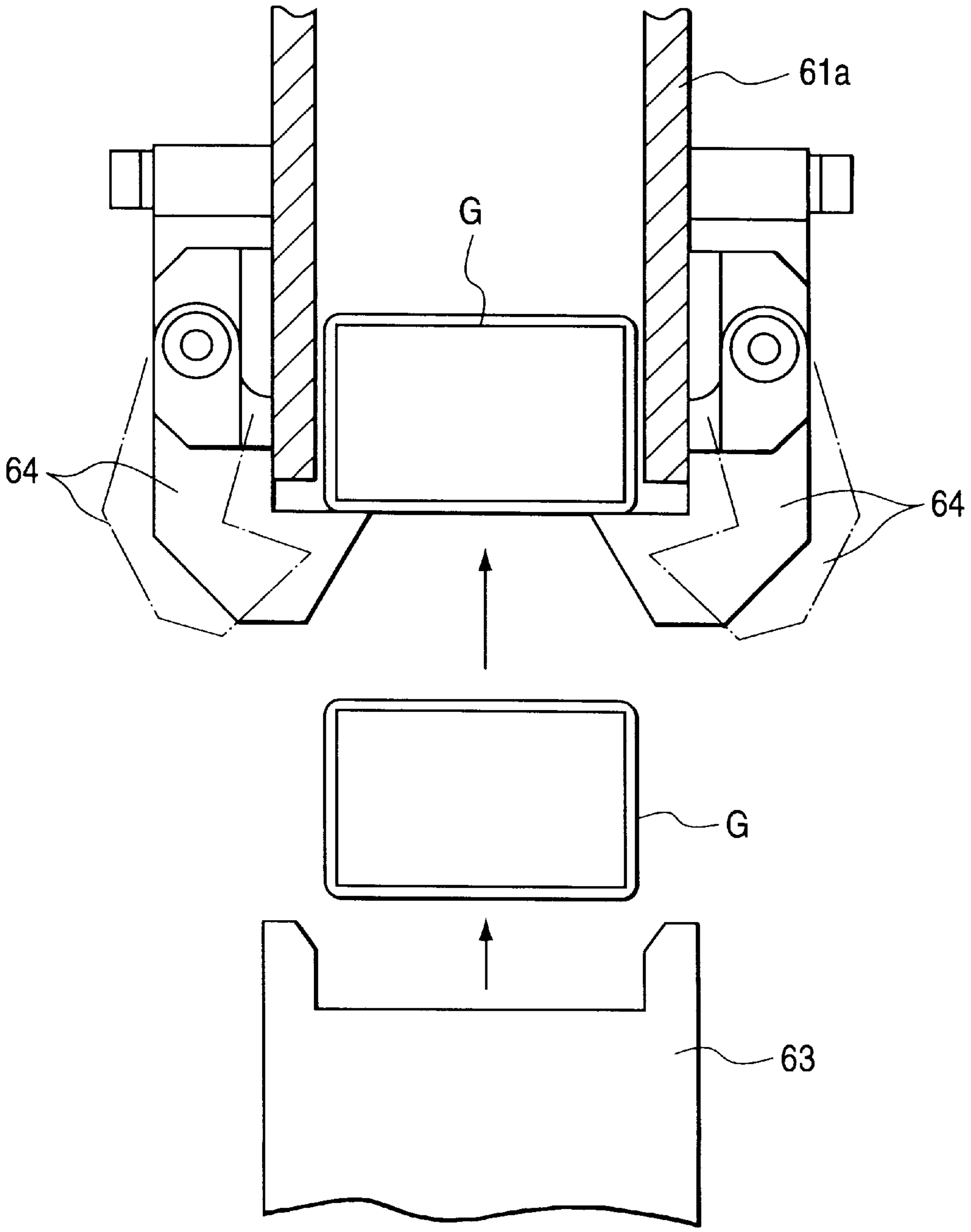
FIG. 18 is an enlarged view of a primary portion of the connector housing accommodating machine.
Figure 19A:
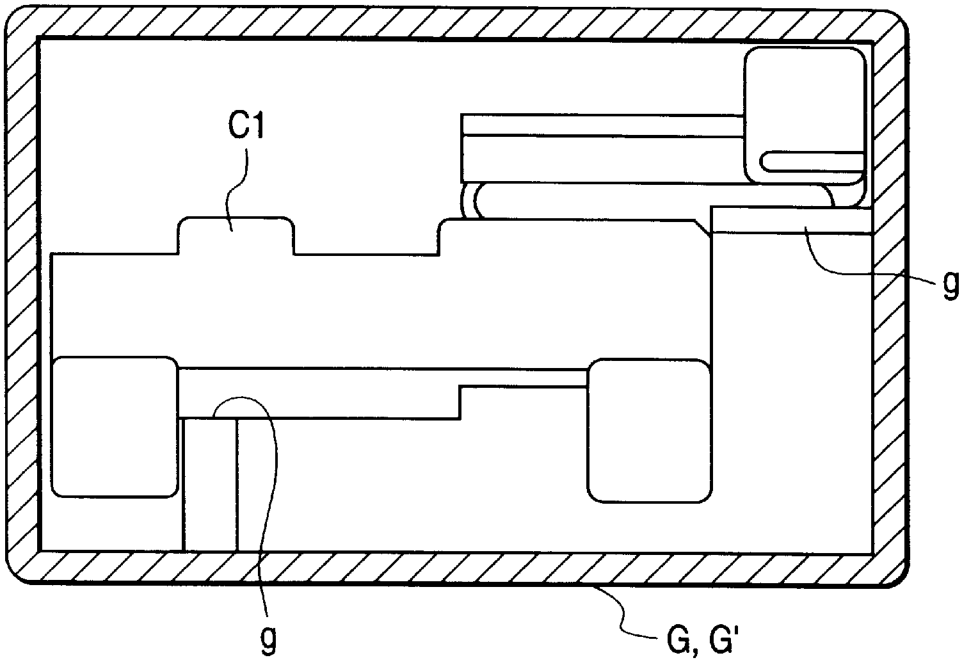
FIGS. 19(*a*) and 19(*b*) show a schematic illustration of a state of the connector housing accommodating machine accommodating magazines.
Figure 19B:
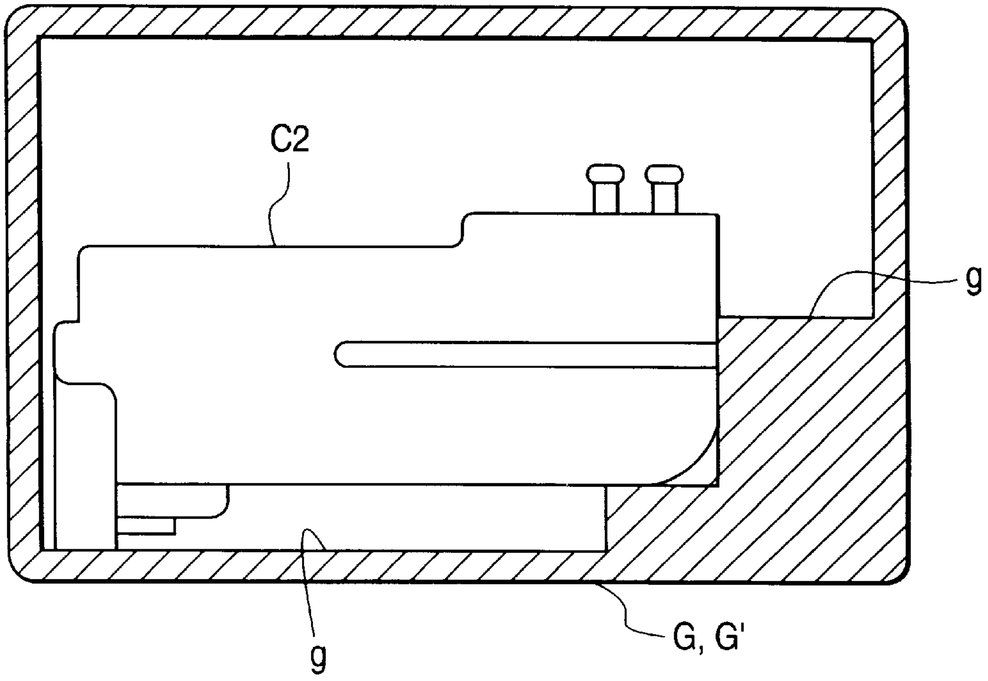

As shown in FIGS. 16 to 18, the accommodating machine 60 is composed as follows. There is provided a base plate 69 fixed to the machine frame H via jigs 68. On the base plate 69, there are provided two rows of holders 61*a*, 62*b*, the sections of which are formed into a C-shape, wherein the inside of the holders 61*a*, 62*b* are opposed to each other. One row of the holders are used as an accommodating section for accommodating magazines G of the housings C in which the terminals are mounted, and the other row of the holders are used as an accommodating section for accommodating vacant magazines G'. As shown in FIG. 19, the magazines G, G' respectively have recess portions g corresponding to the profiles (postures) of the housings $C_1$, $C_2$. In the same manner as described above, the housings C in which the terminals have already been mounted are successively fed from the right end by the feeding arm 52.

After the housing C has been sent to the left end, the magazine G is pushed upward by a pushing member 63 of the air sliding table 62. At this time, the magazine G opens the engaging claw 64 at the lower end of one holder 61*a*. After the magazine G has passed through the engaging claw 64, the engaging claw 64 returns to the initial position, so that the magazine G is held in the holder 61*a*. Magazines G are successively accommodated in one holder 61*a*.

In the base frame 41 on the side of the other holder 61*b*, there is provided an arm 66 oscillated by the air cylinder 65. This arm 66 is engaged with a pin 67*a* of the pushing body 67. As shown in FIG. 17, when the arm 66 is oscillated, the pushing body 67 slides in the longitudinal direction, so that the vacant magazine G' in the other holder 61*b* is moved to a position below one holder 61*a*, that is, the vacant magazine G' in the other holder 61*b* is moved to the conveyance passage c. In this way, the vacant magazines G' are successively fed to the conveyance passage c.

What is claimed is:

1. A device for mounting connector terminals used for a wire harness, the terminals being insertable into connector housings, the device comprising:

a terminal cutting means for individually cutting each terminal from a terminal hoop;

a setting means for individually setting a cut terminal at an inserting position in front of a terminal cavity of a connector housing;

an inserting means for inserting all terminals into the cavities after the terminals have been set at the inserting positions in front of all terminal cavities of the connector housing; and an accommodating means for accommodating the connector housings into which the terminals have been inserted, wherein the above means are successively arranged along a conveyance passage of a conveyance means for linearly conveying the connector housings while the conveyance means hold the connector housings, wherein the conveyance means includes two chuck mechanisms for holding the connector housings, which are fed to the chuck mechanisms one by one in a predetermined position, the chuck mechanisms being arranged on both sides of the conveyance passage so that the chucks can be retracted from the conveyance passage.

2. The device for mounting connector terminals used for a wire harness according to claim 1, wherein the terminal setting means pushes down the cut terminal to an inserting position, and the conveyance means is capable of conveying the connector housing at regular intervals of the terminal cavities of the connector housing so that a front position of the terminal cavity of the connector is positioned at a point where the terminal is pushed down.

3. A device for mounting connector terminals used for a wire harness, the terminals being insertable into connector housings, the device comprising:

a terminal cutting means for individually cutting each terminal from a terminal hoop;

a setting means for individually setting a cut terminal at an inserting position in front of a terminal cavity of a connector housing;

an inserting means for inserting all terminals into the cavities after the terminals have been set at the inserting positions in front of all terminal cavities of the connector housing; and an accommodating means for accommodating the connector housings into which the terminals have been inserted, wherein the above means are successively arranged along a conveyance passage of a conveyance means for linearly conveying the connector housings while the conveyance means hold the connector housings, wherein the terminal setting means pushes down the cut terminal to an inserting position, the conveyance means is capable of conveying the connector housing at regular intervals of the terminal cavities of the connector housing so that a front position of the terminal cavity of the connector is positioned at a point where the terminal is pushed down, the connector housings are fed to the conveyance means by a plurality of parts feeders, and guides for moving the connector housings accommodated in the parts feeders in a predetermined position are arranged between the parts feeders and a connector housing feed position, each guide corresponding to each parts feeder, and each guide can selectively correspond to the conveyance passage.

4. The device for mounting connector terminals used for a wire harness according to claim 1, wherein the chuck mechanism of the conveyance means is capable of moving along the conveyance passage when the chuck mechanism is attached to a ball and screw device driven by a servo motor.

5. The device for mounting connector terminals used for a wire harness according to claim 4, wherein the connector housings are fed to the conveyance means by a plurality of parts feeders, and guides for moving the connector housings accommodated in the parts feeders in a predetermined position are arranged between the parts feeders and a connector housing feed position, wherein each guide corresponds to each parts feeder, and each guide can selectively correspond to the conveyance passage.

6. A device for mounting connector terminals used for a wire harness, the terminals being insertable into connector housings, the device comprising:

a terminal cutting means for individually cutting each terminal from a terminal hoop;

a setting means for individually setting a cut terminal at an inserting position in front of a terminal cavity of a connector housing;

an inserting means for inserting all terminals into the cavities after the terminals have been set at the inserting positions in front of all terminal cavities of the connector housing; and an accommodating means for accommodating the connector housings into which the terminals have been inserted, wherein the above means are successively arranged along a conveyance passage of a conveyance means for linearly conveying the connector housings while the conveyance means hold the connector housings, wherein the connector housings are fed to the conveyance means by a plurality of parts feeders, and guides for moving the connector housings accommodated in the parts feeders in a predetermined position are arranged between the parts feeders and a connector housing feed position, wherein each guide corresponds to each parts feeder, and each guide can selectively correspond to the conveyance passage.

* * * * *